United States Patent
Macias et al.

(10) Patent No.: US 12,055,986 B2
(45) Date of Patent: Aug. 6, 2024

(54) FLEXIBLE AND MODULAR TOP AND BOTTOM SIDE PROCESSOR UNIT MODULE COOLING

(71) Applicant: Intel Corporation, Santa Clara, CA (US)

(72) Inventors: Andres Ramirez Macias, Zapopan (MX); Aardra B. Athalye, Beaverton, OR (US); Devdatta Prakash Kulkarni, Portland, OR (US); Gilberto Rayas Paredes, Zapopan (MX); Bijoyraj Sahu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 573 days.

(21) Appl. No.: 17/187,164

(22) Filed: Feb. 26, 2021

(65) Prior Publication Data
US 2021/0208647 A1 Jul. 8, 2021

(51) Int. Cl.
*G06F 1/20* (2006.01)
*H05K 1/02* (2006.01)

(52) U.S. Cl.
CPC ........... *G06F 1/206* (2013.01); *H05K 1/0272* (2013.01); *G06F 2200/201* (2013.01)

(58) Field of Classification Search
CPC combination set(s) only.
See application file for complete search history.

(56) References Cited

U.S. PATENT DOCUMENTS 5,014,904 A * 5/1991 Morton .................. H05K 7/205
    228/123.1
6,819,562 B2 * 11/2004 Boudreaux ......... H01L 23/4338
    165/185

(Continued)

FOREIGN PATENT DOCUMENTS

JP 2015088888 A 5/2015
WO 2014003976 A1 1/2014

OTHER PUBLICATIONS

Tai Inc.; "Copper Thermal Straps," accessed on the Internet at http://www.tai-inc.us/copper-thermal-straps--heat-straps-thermal-links-.html; 2021; 6 pages.

(Continued)

*Primary Examiner* — Lisa Lea-Edmonds
(74) *Attorney, Agent, or Firm* — Hanley, Flight & Zimmerman, LLC

(57) ABSTRACT

A processor unit module comprises an integrated circuit component attached to a top side of a printed circuit board and one or more electronic components (e.g., voltage regulator FETs, inductors) attached to a bottom side of the board. The printed circuit board is located between a top stiffener plate and a bottom stiffener frame and the three components are secured together by fasteners that connect the top stiffener plate to the bottom stiffener frame. Flexible thermal straps connect the top stiffener plate to one or more slugs located between the printed circuit board and the bottom stiffener frame. The slugs touch the bottom side of the board and are held in place by the bottom stiffener frame. Heat (Continued)

generated by the bottom side components is transported by the slugs and the thermal straps to a thermal management solution (e.g., heat sink, cold plate) attached to the top side of the module.

25 Claims, 12 Drawing Sheets

(56) References Cited

U.S. PATENT DOCUMENTS

| | | | | |
|---|---|---|---|---|
| 8,305,761 | B2* | 11/2012 | Degner | G06F 1/203 |
| | | | | 361/717 |
| 8,897,016 | B2* | 11/2014 | Degner | F28F 1/00 |
| | | | | 361/717 |
| 9,257,364 | B2* | 2/2016 | Ahuja | H01L 21/4882 |
| 9,646,910 | B2* | 5/2017 | Ahuja | H01L 21/4882 |
| 9,818,669 | B2* | 11/2017 | Jones | H05K 7/20445 |
| 10,168,749 | B2* | 1/2019 | Aoki | H05K 7/20254 |
| 10,631,438 | B2* | 4/2020 | Coteus | H01L 23/473 |
| 11,259,447 | B2* | 2/2022 | Gao | G06F 1/20 |
| 11,382,241 | B2* | 7/2022 | Gao | H05K 7/20772 |
| 2004/0150957 | A1* | 8/2004 | Boudreaux | B41J 29/377 |
| | | | | 257/E23.084 |
| 2011/0114294 | A1* | 5/2011 | Degner | H05K 7/2039 |
| | | | | 165/185 |
| 2013/0094141 | A1* | 4/2013 | Degner | G06F 1/203 |
| | | | | 29/890.032 |
| 2016/0043017 | A1 | 2/2016 | Jones et al. | |
| 2016/0155682 | A1* | 6/2016 | Ahuja | H01L 25/50 |
| | | | | 438/122 |
| 2018/0157296 | A1* | 6/2018 | Aoki | H01L 23/473 |
| 2019/0200485 | A1* | 6/2019 | Coteus | H01L 23/367 |
| 2020/0221610 | A1* | 7/2020 | Coteus | G06F 1/20 |
| 2021/0092878 | A1* | 3/2021 | Gao | H05K 7/20772 |
| 2021/0108860 | A1* | 4/2021 | Kulkarni | F28D 15/0275 |
| 2021/0208647 | A1* | 7/2021 | Macias | G06F 1/184 |
| 2022/0151104 | A1* | 5/2022 | Gao | H05K 7/20745 |
| 2022/0256684 | A1* | 8/2022 | Gao | H05K 7/20545 |

OTHER PUBLICATIONS

PCT International Search Report and Written Opinion issued in PCT/US2022/013532, dated May 10, 2022, 11 pages.

International Searching Authority, "International Preliminary Report on Patentability," issued in connection with International Patent Application No. PCT/US2022/013532, mailed on Aug. 29, 2023, 7 pages.

* cited by examiner

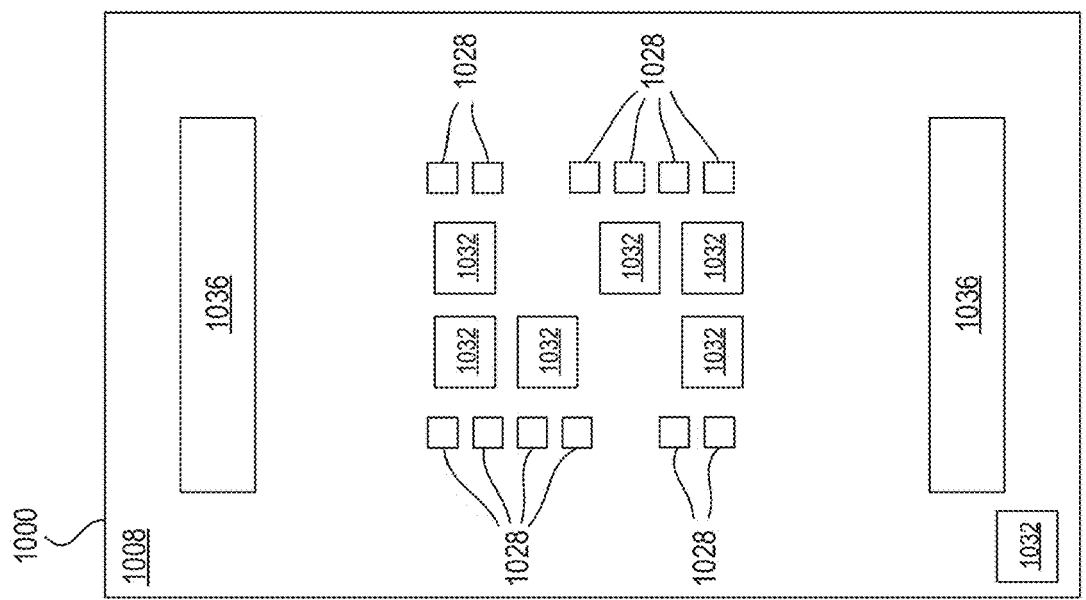
FIG. 10B (BOTTOM)
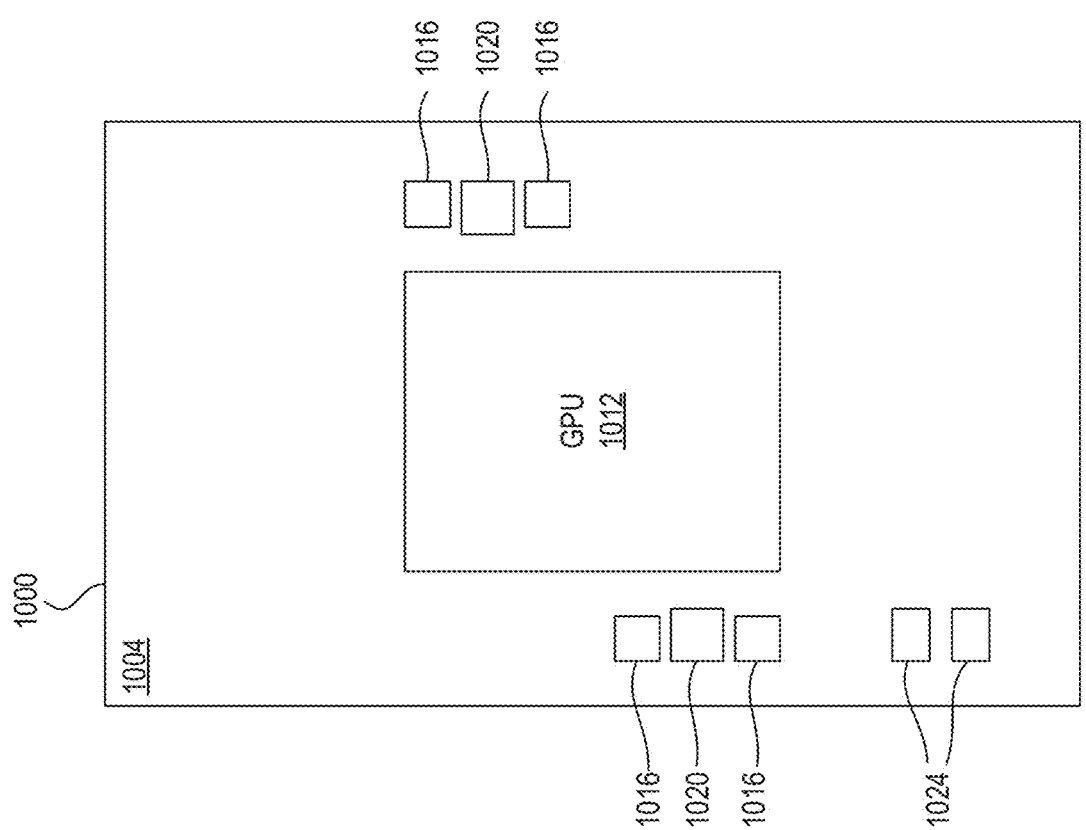
FIG. 10A (TOP)

FLEXIBLE AND MODULAR TOP AND BOTTOM SIDE PROCESSOR UNIT MODULE COOLING

BACKGROUND

Accelerator modules having various form factors can be used in computing systems. The Open Compute Platform's (OCP) Open Accelerator Module (OAM) specification specifies an accelerator module having a mezzanine module form factor and specifies, among other things, module dimensions, module printed circuit board thickness, maximum power consumption levels, connector type, and host interface criteria.

BRIEF DESCRIPTION OF THE DRAWINGS

FIGS. 10A & 10B illustrate an example layout of electronic components on a printed circuit board that is part of an OAM-compliant module.

DETAILED DESCRIPTION

High-end accelerators and accelerator modules, such as those that comply with the Open Compute Platform (OCP) Open Accelerator Module (OAM) specification, face increasingly stringent design constraints as technology advances. The power demands of these accelerators and accelerator modules increase over time, which requires an increasing number of discrete electronic components (e.g., voltage regulator field-effect devices (FETs), inductors, DC-DC converters) to support the increased power consumption. While compact power delivery solutions have been developed to address these high-power demands (e.g., processor units having a thermal design power (TDP) of 600-1000 W), the incorporation of relatively large integrated circuit package sizes (e.g., ~80.0 mm×62.5 mm for a 7 nm Intel® graphics processor unit (GPU)) on relatively small printed circuit boards (e.g., ~165 mm×102 mm OAM-compliant modules) results in significant space limitations for placing power delivery components (e.g., voltage regulator FETs and inductors) on the top side of a module printed circuit board. The large integrated circuit component package size is due not only to an increase in the accelerator processor unit die size but also to the integration of heterogeneous integrated circuit dies (e.g., graphics processing unit (GPU) dies, stacked high bandwidth memory (HBM) dies, serializer/deserializer (SERDES) dies for connectivity) into the integrated circuit component.

The placement of power delivery components on the bottom side of a module circuit board can allow large integrated circuit packages to be integrated on the top side of small boards. In addition to addressing space constraints, placing voltage regulator components on the bottom side of the board can provide power and signal integrity benefits with reduced path resistance (Rpath) enabling more efficient routing of power and signal channels in the board. However, the benefits of locating voltage regulator components on the bottom side of a board do not come without a cost. Cooling these bottom side electronic components can be challenging if the thermal management components to remove heat from the module (e.g., heat sink or liquid-cooled cold plate) are attached to the top of the module.

Figure 1:
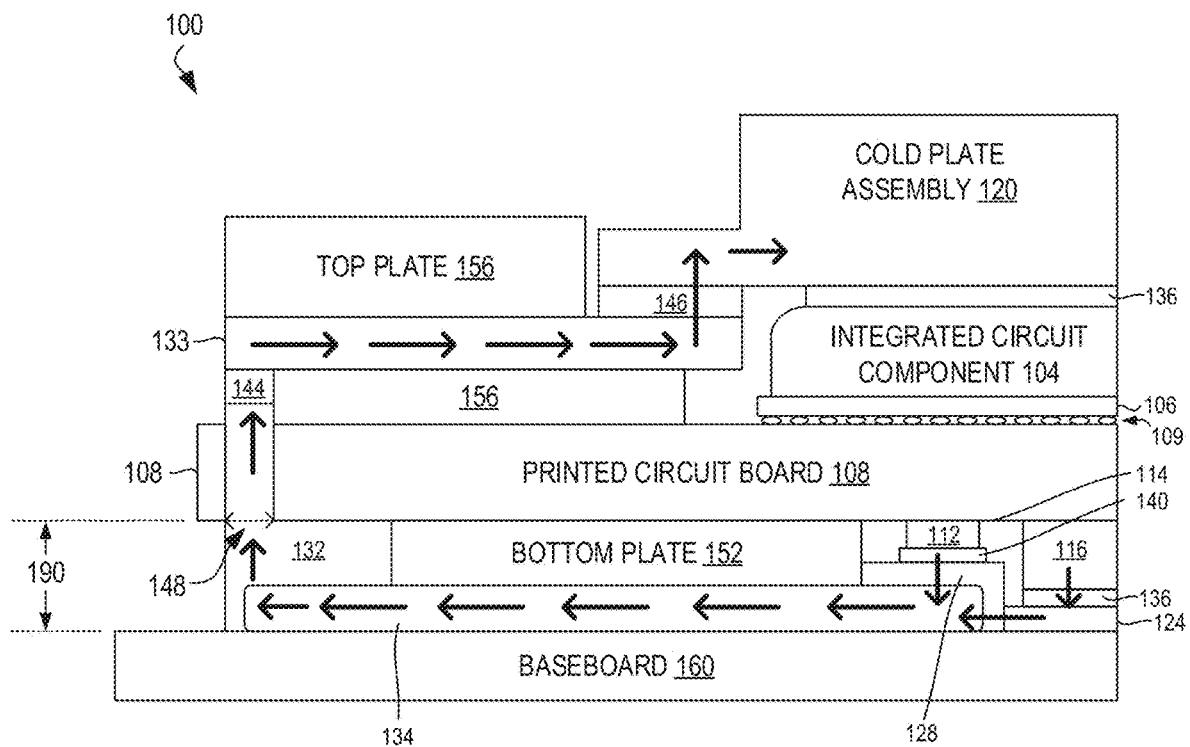
FIG. 1 is a cross-sectional view of a portion of a processor unit module that illustrates design challenges in providing passive cooling to electronic components located on the bottom side of the module.

FIG. 1 is a cross-sectional view of a portion of a processor unit module that illustrates design challenges in providing passive cooling to electronic components located on the bottom side of the module. The module 100 comprises an integrated circuit component 104 comprising a package substrate 106 that is attached to a printed circuit board 108 (e.g., mezzanine printed circuit board) via a solder ball grid array (BGA) 109. Heat generated by a voltage regulator FET 112 and an inductor 116 attached to a bottom side 114 of the printed circuit board 108 is transported to a cold plate assembly 120 via thermally conductive components 124, 128, 132, and 133; heat pipe 134; and thermal interface material (TIM) layers 136, 140, 144, and 146. Performance of the thermal management solution for cooling the bottom side electronic components 112 and 116 is constrained by the low thermal conductivity (<3 W/m×K) of the TIM layers 136, 140, 144, and 146 in the cooling path (indicated by the arrows). Additional constraints include the limited z-height available between the printed circuit board 108 and a baseboard 160 (<5 mm in OAMs) and limited board cut-out areas 148 (<4 mm of width in OAMs) for enabling the heat flux from a bottom stiffener plate 152 to a top stiffener plate 156.

The elimination of even one TIM layer in the cooling path from the bottom side electronic components 112 and 116 to the cold plate assembly 120 is beneficial due to the temperature drop across each TIM layer due to each TIM layer's relatively high thermal resistance. For example, the TIM layer 144 providing a thermal connection between the conductive components 132 and 133 can be responsible for a temperature drop of approximately 10° C. in an OAM-compliant module comprising a GPU with a TDP of 600 W. The performance variation and degradation of TIM layers over time further support reducing the number of TIM layers in a thermal management solution.

The flexible and modular mechanical structures disclosed herein overcome these challenges and provide top and bottom side passive cooling for high-thermal design profile (TDP) processor unit modules. Computational analysis indicates that the disclosed structures may reduce the temperatures observed in a standard TIM-based thermal solution by 10.0° C., which can enable locating high-power voltage regulator designs (e.g., ~30 W) on the bottom side of the module circuit board. In addition to providing improved thermal performance, the technologies disclosed herein provide for a modular design that allows original equipment manufacturer/original design manufacturer (OEM/ODM) flexibility to attach their own cooling solutions (e.g., heat sinks, liquid-cooled cold plates) to processor unit modules. The modularity of the processor unit module allows for OEM/ODMs to design modules that meet their specific needs and for easy serviceability in the field. For example, modules can be removed for replacement or repair without affecting other computing system components, and a module can be removed for service without having to clean and reapply a TIM layer whenever separation of top and bottom stiffener plates are needed.

In the following description, specific details are set forth, but embodiments of the technologies described herein may be practiced without these specific details. Well-known circuits, structures, and techniques have not been shown in detail to avoid obscuring an understanding of this description. "An embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner "Connected" may indicate elements are in direct physical or electrical contact with each other and "coupled" may indicate elements that co-operate or interact with each other, but they may or may not be in direct physical or electrical contact. For example, components that are thermally coupled may have one or more elements located between them. Terms modified by the word "substantially" include arrangements, orientations, spacings, or positions that vary slightly from the meaning of the unmodified term. For example, a top stiffener plate that is referred to as being substantially parallel to a bottom stiffener frame includes top stiffener plates that are within several degrees of being parallel to the bottom stiffener frame.

As used herein, the term "integrated circuit component" refers to a packaged or unpacked integrated circuit product. A packaged integrated circuit component comprises one or more integrated circuits mounted on a package substrate. In one example, a packaged integrated circuit component contains one or more processor units mounted on a substrate, an exterior side of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component described or referenced herein, such as a processor unit (e.g., system-on-a-chip (SoC), processor cores, graphics processor unit (GPU), accelerator), I/O controller, chipset processor, memory, or network interface controller. As used herein, the term "electronic component" can refer to an active electronic component (e.g., processor unit, memory, storage device, FET) or a passive electronic component (e.g., resistor, inductor, capacitor).

The description may use the phrases "in an embodiment," "in embodiments," "in some embodiments," and/or "in various embodiments," each of which may refer to one or more of the same or different embodiments. Furthermore, the terms "comprising," "including," "having," and the like, as used with respect to embodiments of the present disclosure, are synonymous.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Figure 2:
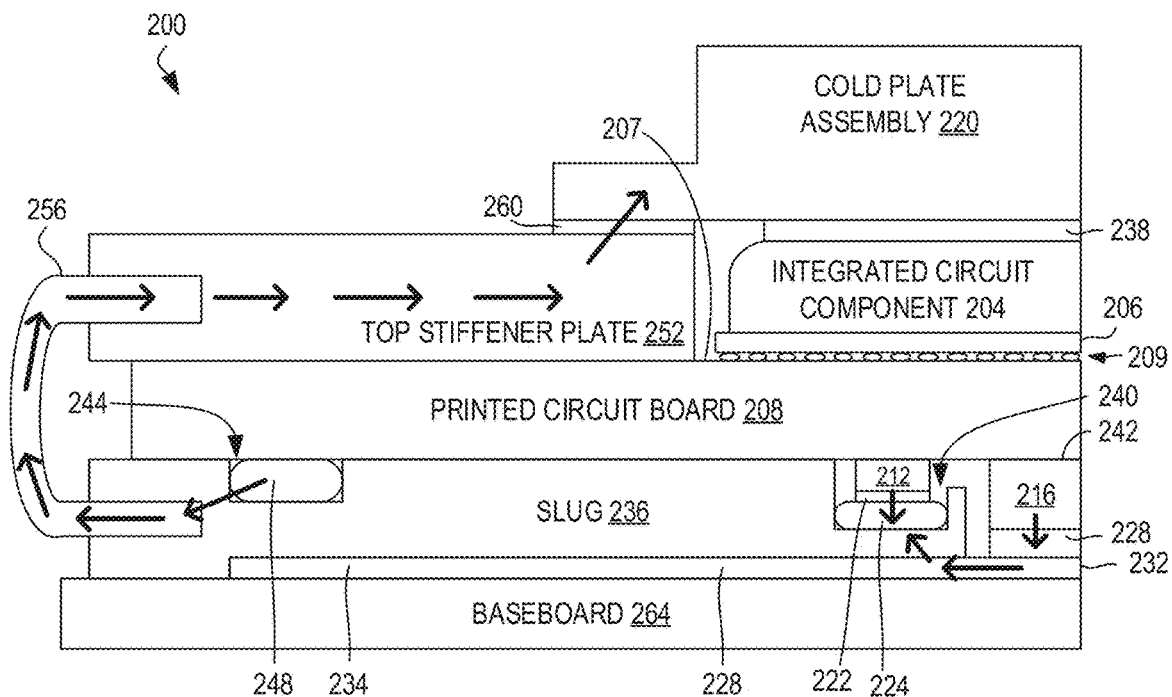
FIG. 2 is a cross-sectional view of a portion of a processor unit module comprising flexible thermal straps as part of a thermal management solution to cool electronic components located on the bottom side of the module.

FIG. 2 is a cross-sectional view of a portion of a processor unit module comprising flexible thermal straps as part of a thermal management solution to cool electronic components located on the bottom side of the module. The module 200 comprises an integrated circuit component 204 comprising a package substrate 206 that is attached to a top side 207 a mezzanine printed circuit board 208. The integrated circuit component 204 is attached to the board 208 via a BGA 209, but can be attached to the printed circuit board 208 in other manners. The integrated circuit component 204 is thermally coupled to a cold plate assembly 220 via a TIM layer 238. The cold plate assembly 220 is part of a liquid cooling system for a computing system comprising the integrated circuit component 204. Cooling liquid enters a fluid inlet (not shown) of the cold plate assembly 220, absorbs heat generated by the integrated circuit component 204 during operation, and exits the cold plate assembly 220 via a fluid outlet (not shown). As used herein, the phrase "thermally coupled" refers to components that are coupled to facilitate the transfer of heat.

Attached to a bottom side 242 of the printed circuit board 208 is a voltage regulator FET (VR FET) 212 and an inductor 216. A TIM layer 222 thermally couples the VR FET 212 to a first heat pipe 224 and a TIM layer 228 thermally couples the inductor 216 to a bottom stiffener frame 232. A slug 236 comprises recesses 240 and 244 in which the first heat pipe 224 and a second heat pipe 248 are located. The slug 236 is connected to a top stiffener plate 252 via a flexible thermal strap 256. The top stiffener plate 252 is located adjacent to the printed circuit board 208 and the slug 236 is located adjacent to the bottom stiffener frame 234. One or more fasteners (not shown) attach the top stiffener plate 252 to the bottom stiffener frame 234 and secures the top stiffener plate 252, the printed circuit board 208, the slug 236, and the bottom stiffener frame 234 together. The top stiffener plate 252 is thermally coupled to the cold plate assembly 220 via a TIM layer 260. The TIM layers described herein may be any suitable material, such as a silver thermal compound, thermal grease, phase change materials, or graphite sheets. The module 200 can be removably coupled to a baseboard 264 (e.g., system board, mainboard, motherboard) via one or more fasteners (not shown). The baseboard 264 can comprise one or more additional computing system components in addition to the integrated circuit component 204, such as one or more processor units, memory, storage, network controllers, as well as one or more additional processor unit modules.

The flow of heat generated by the electronic components 212 and 216 from the printed circuit board bottom side 242 to the code plate assembly 220 is illustrated by the arrows in FIG. 2. Heat generated by the VR FET 212 flows through the TIM layer 222, the first heat pipe 224, the second heat pipe 248, the slug 236, the thermal strap 256, the top stiffener plate 252, and the TIM layer 260 to reach the cold plate assembly 220. The heat pipes 224 and 248 are thermally coupled, with an example coupling illustrated in FIG. 8. Heat generated by the inductor 216 follows a similar path, but with the heat flowing through the TIM layer 228, the bottom stiffener frame 232, and the slug 236 before reaching the first heat pipe 224. The thermal management solution illustrated in FIG. 2 does a better job at cooling the bottom side electronic components than that illustrated in FIG. 1 as the flow of heat passes through one less TIM layer. That is, the TIM layer 144 in the thermal management solution illustrated in FIG. 1 has been replaced with the thermal strap 256. The thermal strap 256, which can be made of copper, and its attachments to the top stiffener plate 252 and the slug 236 (the strap can be soldered or brazed to the top plate 252 and the slug 236) have a lower thermal resistance than the TIM layer 144. In addition to helping provide a lower thermally resistive path from the bottom side electronic components 212 and 216 to the cold plate assembly 220, the thermal strap 256 provides a mechanically robust yet flexible connection between two rigid structures (the top stiffener plate 252 and the slug 236). Although shown in FIG. 2 as connecting two substantially parallel structures that are offset by a vertical amount, the thermal strap can connect two structures that are offset by a relatively large amount (the thermal strap just needs to be long enough) and can connect two structures that are parallel, perpendicular, or have another orientation with respect to each other.

Figure 3:
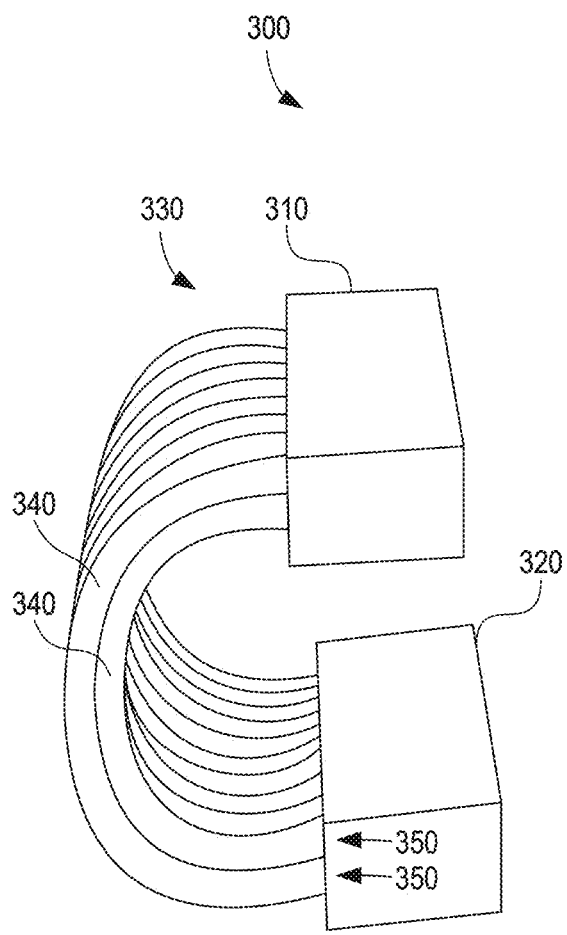
FIG. 3 shows an example copper thermal strap.

In some embodiments, the flexible thermal strap 256 is a copper thermal strap comprising a plurality of copper ropes. FIG. 3 shows an example flexible copper thermal strap. The flexible thermal strap 300 comprises a first slug 310 attached to a second slug 320 by a plurality of flexible copper ropes (or cables) 340, with each copper rope comprising a plurality of copper wires that are twisted together. In other embodiments, the copper ropes comprise copper wires that are braided together. The strap 300 comprises two stacked rows 350 of copper ropes 340. The ropes 340 create a connection between the slugs 310 and 320 that is more mechanically reliable and has a lower thermal resistance than a TIM layer. In some embodiments, any of the flexible thermal straps disclosed herein can be a graphite thermal strap. In some embodiments, graphite thermal straps comprise a plurality of graphite ropes, each rope comprising a plurality of graphite fibers that are twisted or braided together. In some embodiments, a flexible thermal strap can be a carbon-based strap other than a graphite strap. In still other embodiments, any of the flexible thermal straps disclosed herein comprises a plurality of stacked graphite, aluminum, or copper sheets (or foils) connected to slugs on either side.

The thermal strap 256 can be attached to the top stiffener plate 252 and the slug 236 via soldering or brazing. In some embodiments, the top stiffener plate 252 and the slug 236 are made of copper. Although a cold plate assembly 220 is shown in FIG. 2 as providing cooling for the module 200, in other embodiments, a heat sink or other thermal management component can be used as part of a thermal management solution for cooling the module 200.

Figure 4:
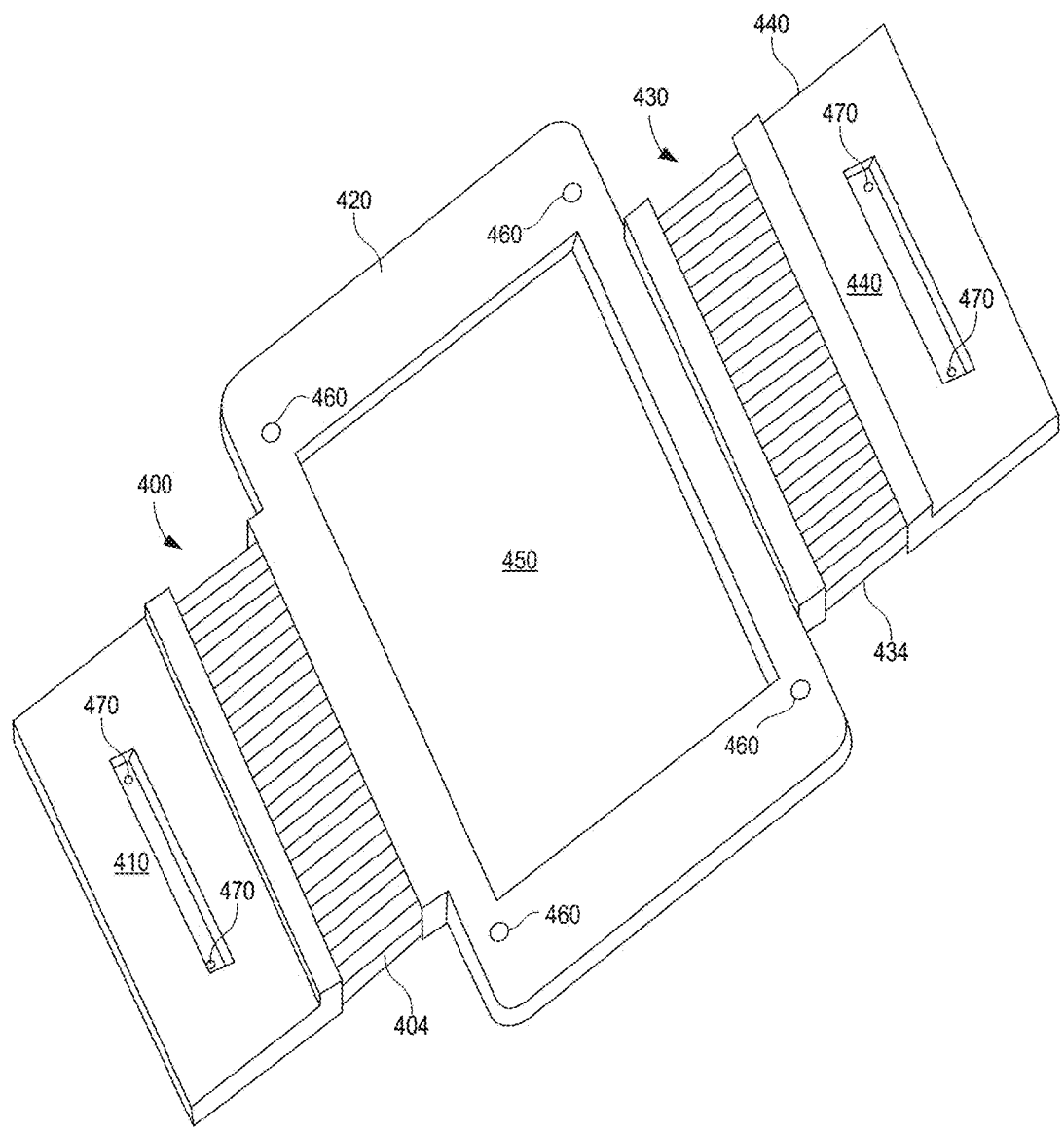
FIG. 4 illustrates example flexible thermal straps attached to an example frame and slugs.

FIG. 4 illustrates example flexible thermal straps attached to an example frame and slugs. A first flexible thermal strap 400 connects a first slug 410 to a frame 420 and a second flexible thermal strap 430 connects a second slug 440 to the frame 420. The thermal strap 400 comprises a plurality of ropes 404 that are each attached at a first end to the slug 410 and a second end to the frame 420. The thermal strap 430 comprises a plurality of ropes 434 that are each attached at a first end to the slug 440 and a second end to the frame 420. The straps 400 and 430, slugs 410 and 440, and frame 420 are made of copper. In other embodiments, one or more of these components can be made of other materials. For example, in other embodiments, the flexible thermal straps 400 and 430 can be graphite thermal straps. The frame 420 comprises a first opening 450 to accommodate an integrated circuit component attached to a module printed circuit board when the module is assembled and a plurality of second openings 470 to accommodate fasteners that secure the slugs 410 and 440 to a bottom stiffener frame when the module is fully assembled. The straps 400 and 430 each comprise a single row of 26 ropes. In other embodiments, the straps 400 and 430 can comprise more or fewer ropes and/or additional rows, and the number of ropes and rows used can be based on the cooling needs of electronic components attached to a bottom side of a printed circuit board against which the frame 420 is pressed against when the frame 420 is in an assembled processor unit module. In some embodiments, the frame 420 is attached to a top stiffener plate via soldering or brazing. FIG. 4 illustrates straps 400 and 430, slugs 410 and 440, and the frame 420 in a "flattened" configuration. As will be discussed below, during assembly, the slugs 410 and 440 and the straps 400 and 430 are wrapped around opposite edges of a module printed circuit board and pressed against the bottom side of the board.

As used herein, the term "strap" can refer to a discrete strap that can be attached (via soldering, brazing, etc.) to other components, such as strap 300, or a strap that is integrated into a larger component, such as straps 400 and 430.

Figure 5:
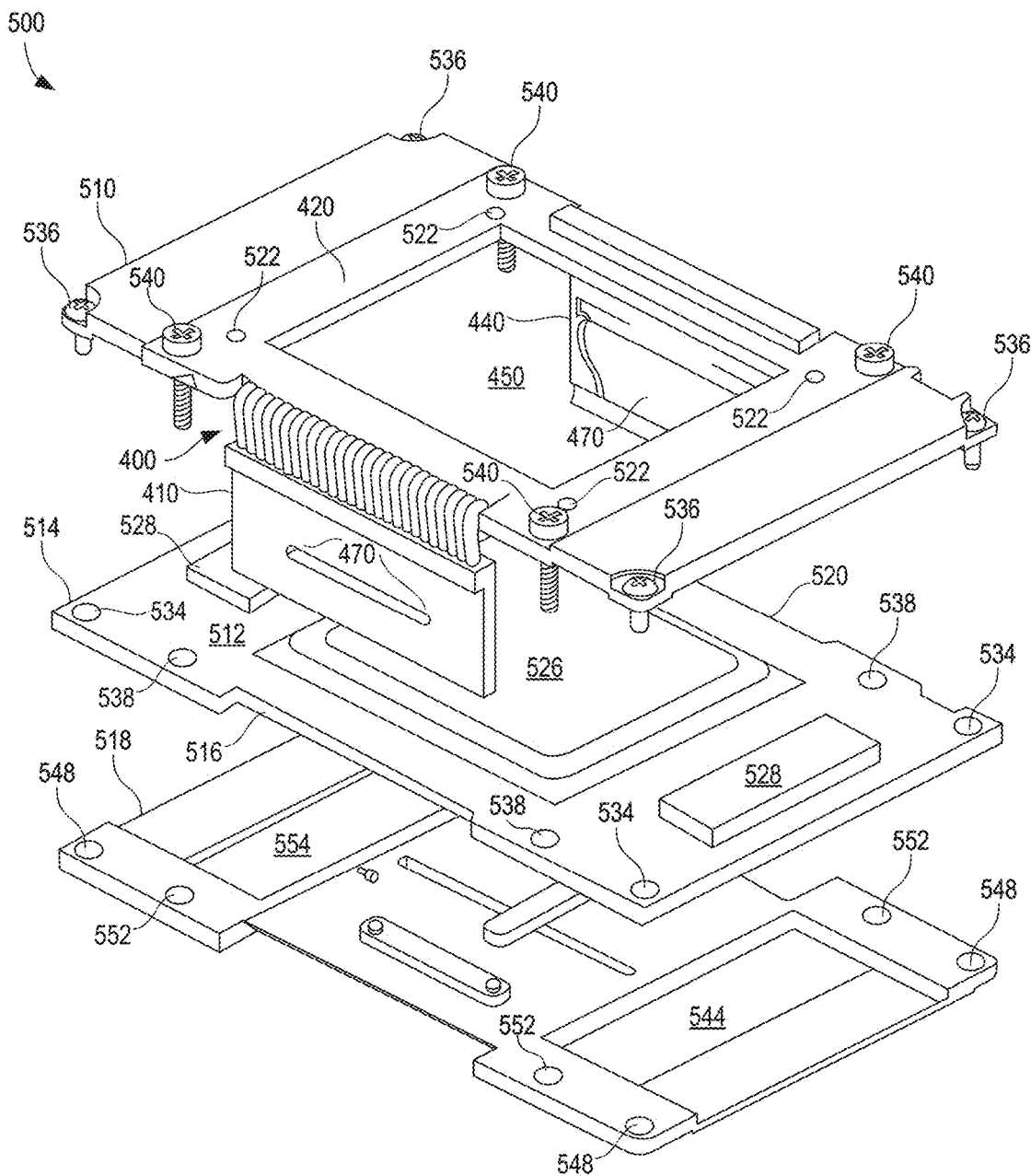
FIG. 5 is an exploded top side view of an example processor unit module.

FIG. 5 is an exploded top side view of an example processor unit module. In some embodiments, the module 500 can be an OAM-compliant accelerator module. The module 500 comprises a top stiffener plate 510, a printed circuit board 514, and a bottom stiffener frame 518. The top stiffener plate 510 comprises the frame 420 attached to the flexible thermal strap 400 that is in turn attached to the first slug 410, and the second flexible thermal strap 430 (not shown in FIG. 5) that is in turn attached to the second slug 440. Although not shown in FIG. 5, the top stiffener plate 510 extends underneath the frame 420 such that the top stiffener plate 510 is located between the printed circuit board 514 and the frame 420 when the module 500 is assembled. The frame 420 can be attached to the top stiffener plate 510 via soldering or brazing. A thermal management component (e.g., heat sink, cold plate) is attached to the top stiffener plate 510 by a plurality of fasteners (e.g., screws) that are received in openings 522 in the frame 420. In some embodiments, the frame 420 is made of copper and the top stiffener plate 510 is made of aluminum. In other embodiments, the features of the top stiffener plate 510 and the frame 420 are integrated into a unitary top stiffener plate. In some embodiments, a unitary top stiffener plate integrating the features of the top stiffener plate 510 and the frame 420 is made of copper. In some embodiments, the top stiffener plate 510 or the frame 420, or both, could be made of stainless steel.

Attached to a top side 512 of the circuit board 514 are an integrated circuit component 526 and inductors 528. The integrated circuit component 526 occupies in the opening 450 of the frame 420 when the module 500 is assembled. The board 514 comprises a first plurality of board openings 534 to accommodate a first plurality of fasteners 536 (e.g., screws) that secure the top stiffener plate 510 to the bottom stiffener frame 518 and a second plurality of board openings 538 to accommodate a second plurality of fasteners 540 (e.g., screws) that secure the module 500 to a baseboard (not shown).

The bottom stiffener frame 518 comprises connector openings 544 to accommodate connectors located on the bottom side of the circuit 514 (not shown) to connect the module 500 to the baseboard, a first plurality of bottom frame openings 548 to accommodate the first plurality of fasteners 536 and a second plurality of bottom frame openings 552 to accommodate the second plurality of fasteners 540.

Figure 6:
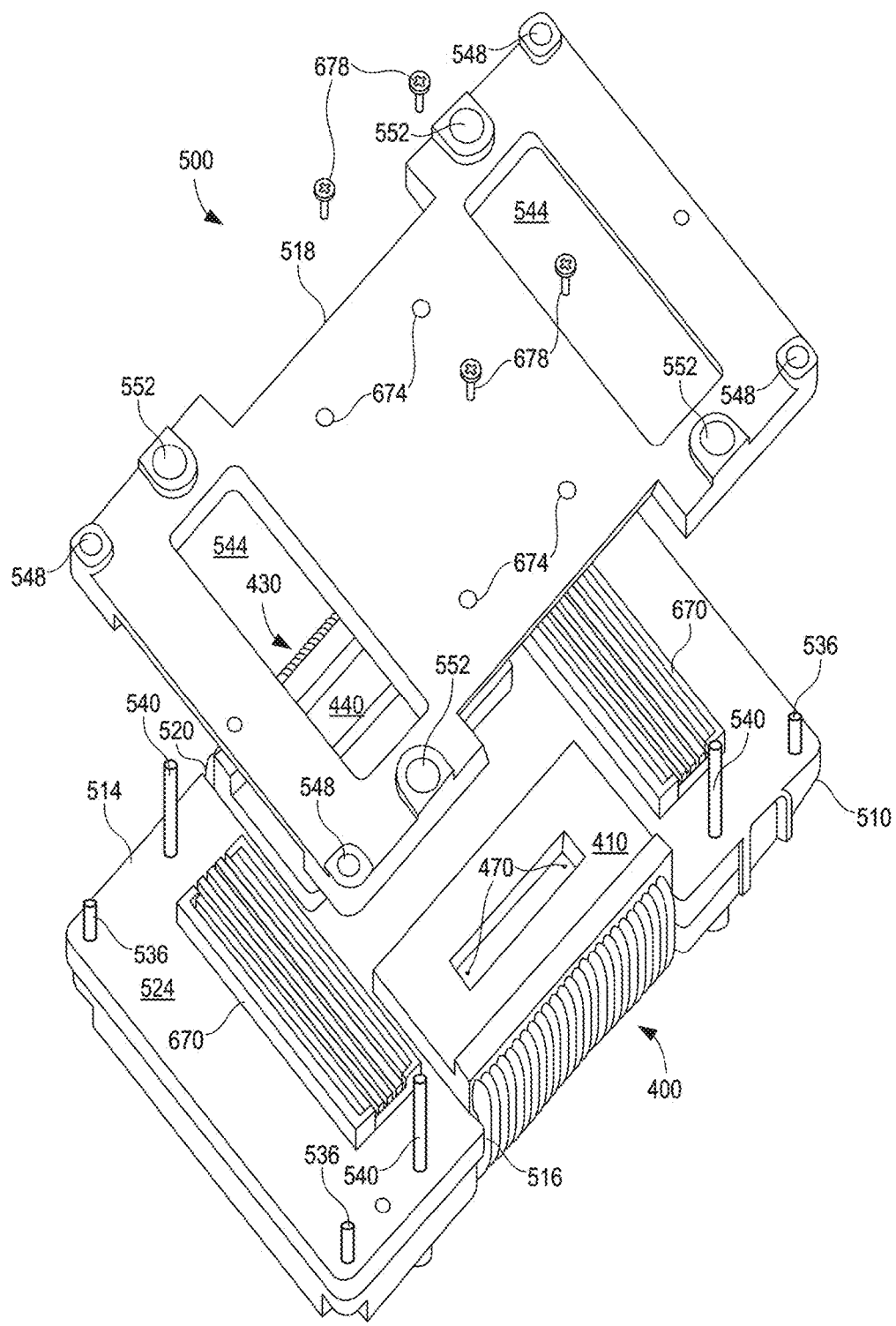
FIG. 6 is a partially exploded bottom side view of the example module of FIG. 5.

FIG. 6 is a partially exploded bottom side view of the example module of FIG. 5. The top stiffener plate 510 is located adjacent to and the slugs 410 and 440 have been wrapped around opposite edges 516 and 520, respectively, of the printed circuit board 514. A pair of connectors 670 are attached to a bottom side 524 of the printed circuit board 514 to attach the module 500 to a baseboard. The connectors 670 are accommodated by the openings 544 in the bottom stiffener frame 518 when the module 500 is fully assembled. The bottom stiffener frame 518 comprises openings 674 to accommodate fasteners 678 (e.g., screws) that are received in slug openings 470 and attach the bottom stiffener frame 518 to the slugs 410 and 440.

Figure 7:
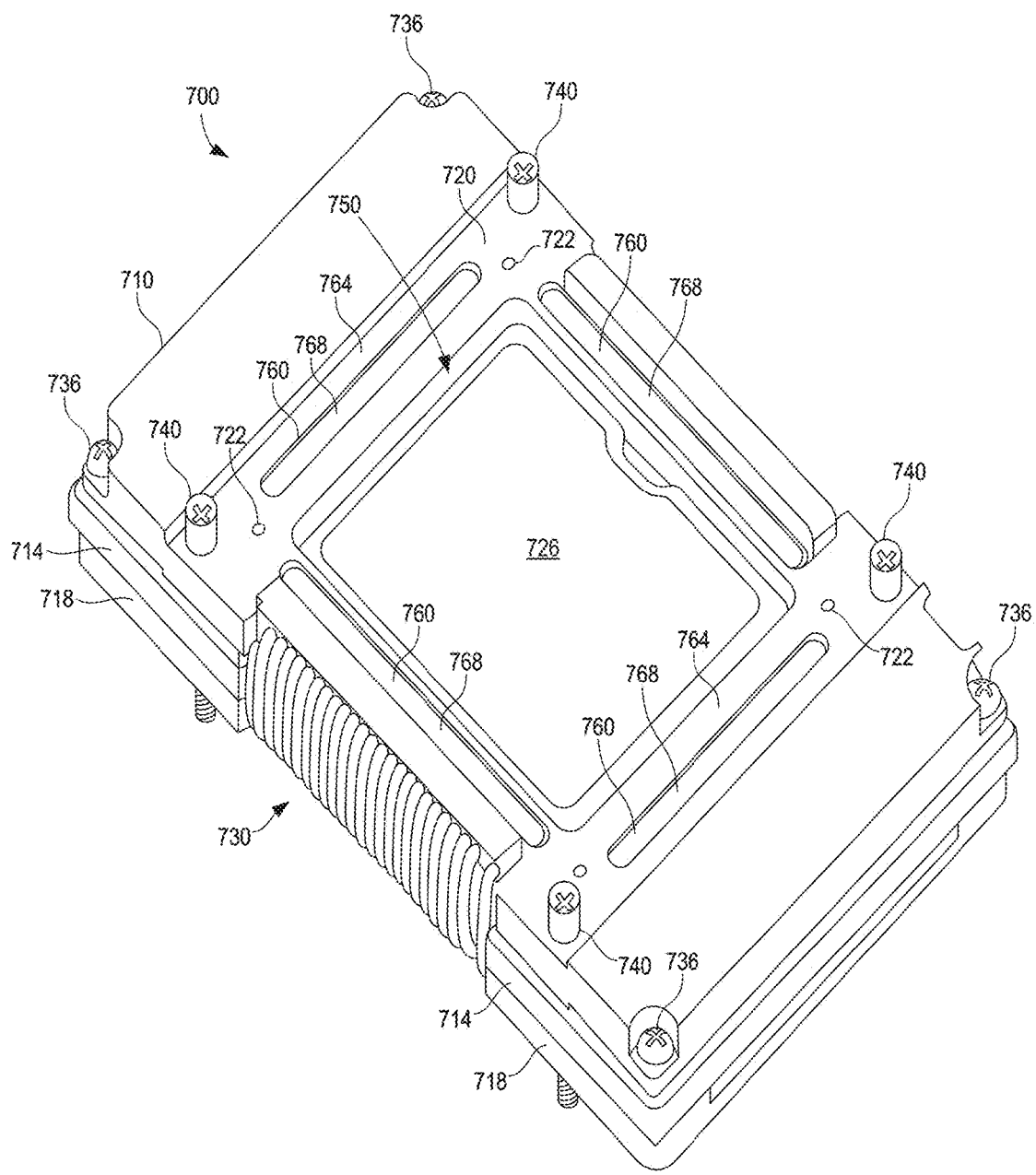
FIG. 7 is an isometric top view of an example assembled module.

FIG. 7 is an isometric top view of an example assembled module. The module 700 comprises a printed circuit board 714 located between a top stiffener plate 710 and a bottom stiffener frame 718. The fastening of the top stiffener plate 710 to the bottom stiffener frame 718 via fasteners 736 (e.g., screws) causes the printed circuit board 714 to be pressed against the top stiffener plate 710 and the bottom stiffener frame 718. The top stiffener plate 710 comprises an opening 750 that is occupied by an integrated circuit component 726 attached to a top side of the printed circuit board 714. The top stiffener plate 710 comprises a metal frame 720 to which a flexible thermal strap 730 is attached. The strap 730 is wrapped around an edge 716 of and attached to the bottom side of the printed circuit board 714.

The frame 720 further comprises a plurality of heat pipes 760 incorporated into a top surface 764 of the frame 720. A thermal management component (e.g., cold plate, heat sink) can be attached to the module 700 via fasteners that are received in the openings 722. The heat pipes 760 distribute the heat generated by electronic components attached to the bottom side of the printed circuit board 714 and transported to the frame 720 along the surfaces of the module 700 to which a thermal management component (e.g., heat sink, cold plate) attaches (e.g., top surfaces 768 of heat pipes 760 and the top surface 764 of the frame 720). The module 700 fastens to a baseboard via fasteners (e.g., screws) 740.

FIG. 7 illustrates the modularity of the module 700. Various thermal management components can be attached to the module 700 and the module 700 can be easily removed from a baseboard by unfastening the module 700 from the baseboard for replacement or repair.

Figure 8:
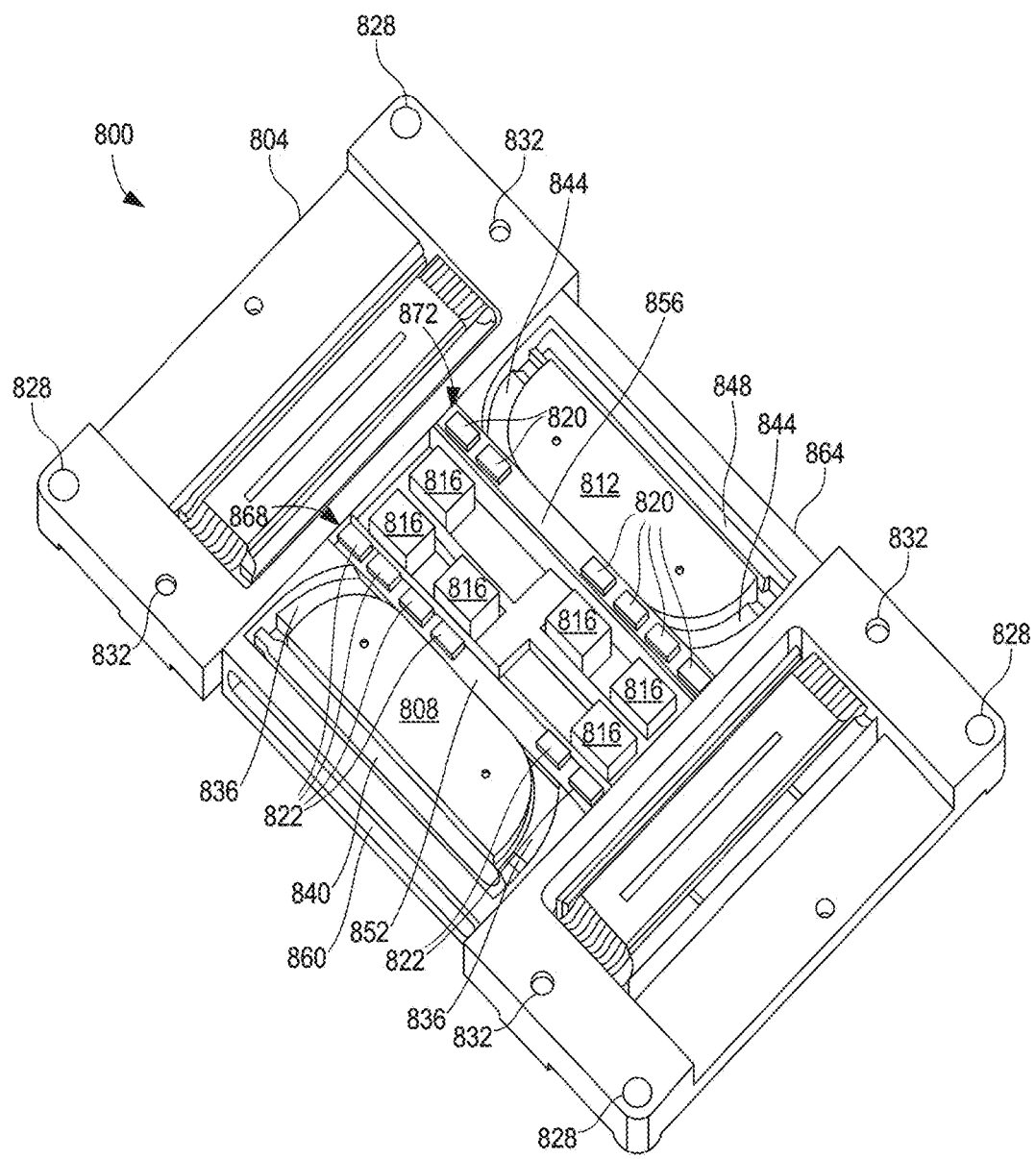
FIG. 8 is an isometric top view of an example assembled module with various module components not shown.

FIG. 8 is an isometric top view of an example assembled module with various module components not shown. The module 800 comprises a bottom stiffener frame 804, a first slug 808, a second slug 812, inductors 816, and voltage regulator FETs 820 and 822. The bottom stiffener frame 810 further comprises a plurality of openings 828 to accommodate fasteners that secure the bottom stiffener frame 804 to a top stiffener plate of the module (not shown) and a plurality of openings 832 to accommodate fasteners that secure the module 800 to a baseboard.

The inductors 816 and the VR FETs 820 and 822 are attached to the bottom side of the module printed circuit board (not shown). The first slug 808 comprises heat pipes 836 and 840 and the second slug 808 comprises heat pipes 844 and 848. A TIM layer 852 thermally couples the FETs 822 to the heat pipe 836 and a TIM layer 856 thermally couples the FETS 820 to the heat pipe 844 of the second slug 812. Portions of the heat pipes 836 and 844 are obscured by the TIM layers 852 and 856, respectively. The heat pipes 836 and 840 carry heat generated by the VR FETs 822 to a flexible thermal strap (not shown) attached to or integrated into an end 860 of the first slug 808 and the heat pipes 844 and 848 carry heat generated by the FETs 820 to a flexible thermal strap (not shown) attached to or integrated into an end 864 of the second slug. The heat pipes 836, 840, 844, and 848 also carry heat generated by the inductors 816 to the flexible thermal straps, with the bottom stiffener frame 804 transporting the heat generated by the inductors 816 to the heat pipes 836 and 844. As previously discussed, the flexible thermal straps carry the heat generated by the bottom side electronic components (e.g., the FETs 820 and 822, and the inductors 816) to thermal management components attached to the top of the module 800.

Although the TIM layer 852 is shown as extending along the length of a recess 868 in the first slug 808 and the TIM layer 856 is shown as extending along the length of a recess 872 in the second slug 812, in other embodiments, the TIM layers 852 and 856 could be present only in the portions of the recesses 868 and 872 that are proximate to FETs 822 and 820.

Many variations of the module 800 are possible. For example, the slugs 808 and 812 can extend further inwards toward the center of the bottom stiffener frame 804 such that heat generated by the inductors 816 is transported directly to the slugs without having to be transported first through the bottom stiffener frame 804. In such embodiments, TIM layers can thermally couple the inductors 816 to heat pipes in the slugs 808 and 812. In other embodiments, the slugs 808 and 812 can be narrower or wider than shown in FIG. 8 to accommodate fewer or more ropes in a strap. Further, in some embodiments, a module comprises only one slug and one flexible thermal strap to remove heat from bottom side electronic components. In some embodiments, more, fewer, or different types of electronic components can be attached to the bottom side of the module printed circuit board than the VR FETs 820 and 820 and the inductors 816. In some embodiments, the bottom stiffener frame 804 can have one connector or more than two connectors for connecting to a baseboard. Further, in some embodiments, the slugs can comprise vapor chambers instead of heat pipes.

Figure 9:
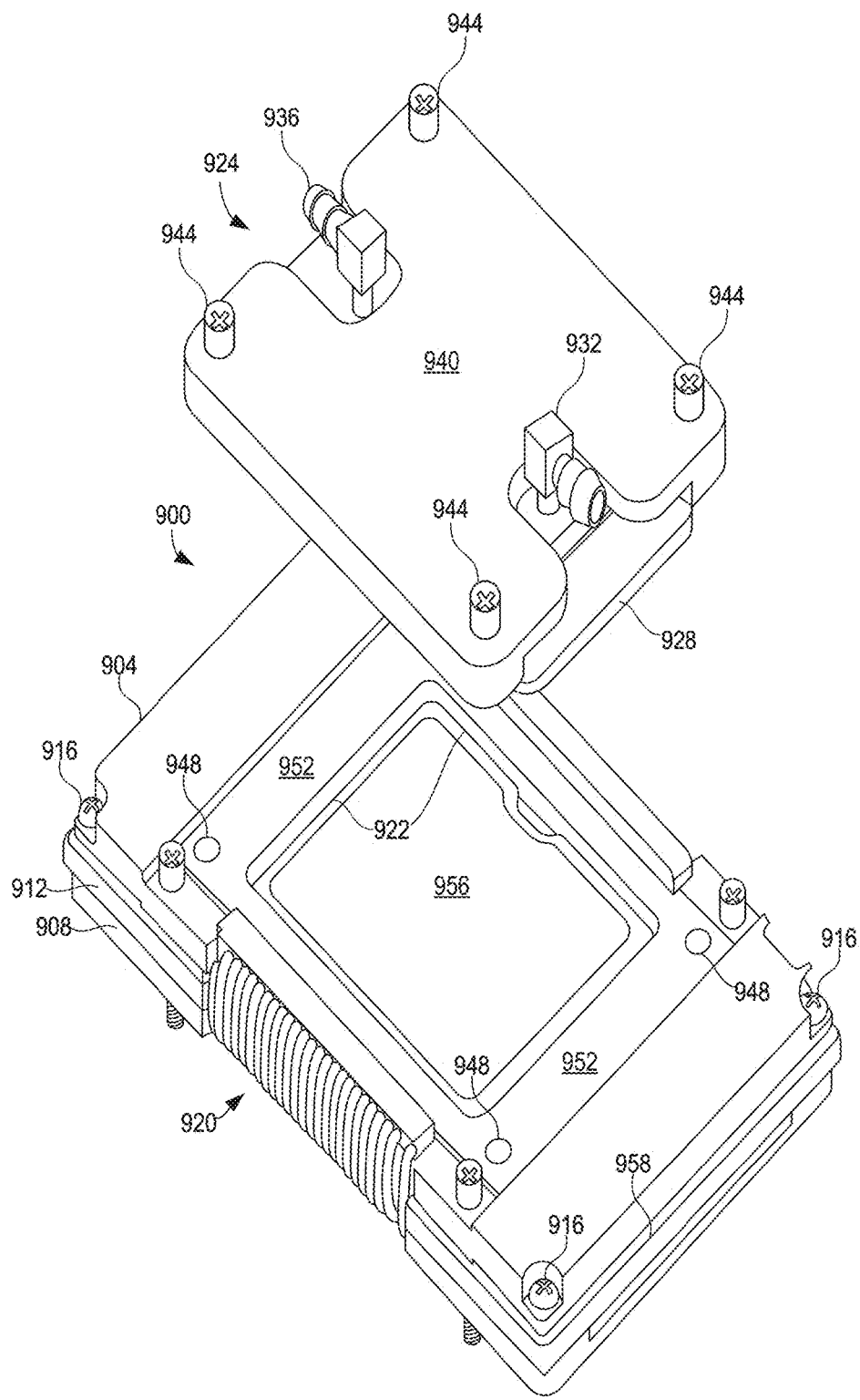
FIG. 9 illustrates an isometric view of an example assembled processor unit module and cold plate assembly.

FIG. 9 illustrates an isometric view of an example assembled processor unit module and cold plate assembly. The module 900 comprises a top stiffener plate 904, a printed circuit board 908, and a bottom stiffener board 912 secured together by fasteners 916 (e.g., screws). A flexible thermal strap 920 transports heat generated by electronic components attached to the bottom side of the printed circuit board 908 to a frame 922 that is attached to the top stiffener plate 904. A cold plate assembly 924 comprises a cold plate 928, a fluid inlet 932, a fluid outlet 936, and a mounting plate 940. The cold plate assembly 924 is attached to the module 900 by fasteners 944 (e.g., screws) received by openings 948 in the module 900. A first TIM layer 952 provides thermal coupling between the cold plate 928 and the frame 922 and a second TIM layer (not shown) provides thermal coupling between the cold plate 928 and an integrated circuit component 956 attached to a top side 958 of the printed circuit board 908.

The cold plate assembly 924 provides liquid cooling for the integrated circuit component 956 via cooling liquid entering the fluid inlet 932, the cooling liquid absorbing heat generated by the integrated circuit component 956 as the cooling liquid passes through the cold plate 928, and heated cooling liquid exiting the cold plate 928 via the fluid outlet 936. As it passes through the cold plate 928, the cooling liquid also absorbs heat generated by electronic components attached to the bottom side of the printed circuit board 908 that has been transported to the frame 922.

In some embodiments, the cold plate assembly 924 can be part of a liquid cooling system that provides liquid cooling to one or more additional electronic components in a computing system. For example, the cold plate assembly 924 can be part of a loop that provides liquid cooling to one or more additional processor units in the computing system. Any of the additional processor units can be located in a module of any type disclosed herein or otherwise attached (e.g., via a socket or directly attached) to a baseboard of the computing system. The cold plate assembly 924 can be connected via one or more conduits to a heat exchanger that removes heat from the cooling liquid and a pump that circulates the cooling liquid through a liquid cooling loop to which the cold plate assembly 924 belongs. In some embodiments, the pump circulates cooling fluid through a closed loop that is dedicated to the computing system within which the module 900 and cold assembly 924 are located, and in other embodiments, the heat exchanger and pump can be external to the computing system. As an example of the latter, the module 900 can be part of a rack-level computing solution (e.g., sled, tray, or blade computing system) and the cold plate assembly 924 can be part of a rack-level, multi-rack level, or partial-rack level liquid cooling system. For instance, the cold plate assembly 924 can be part of a rack-level liquid cooling system that comprises a cooling distribution unit that supplies cooling liquid to multiple computing systems within a rack.

In other embodiments, the module 900 can be attached to other types of thermal management components, such as a heat sink. A heat sink can comprise a plurality of fins that dissipate absorbed heat into the environment around the heat sink. In some embodiments, one or more fans can cool the air around a heat sink by blowing heated air around the heat sink out of the computing system.

In some embodiments, any module of the type illustrated in FIGS. 5-9 (that is, comprising a printed circuit board having electronic components attached to its top and bottom sides and sandwiched between a bottom stiffener frame and a top stiffener plate comprising one or more flexible thermal straps to cool the bottom side electronic components) can be assembled and joined with a thermal management component or assembly as follows. First, the top stiffener plate, with its attached or integrated flexible thermal straps in an opened or flattened position (see FIG. 5) are aligned and placed on top of the printed circuit board. Second, the slugs are moved into a closed position by wrapping the slugs around edges of the printed circuit board until the slugs contact the bottom side of the printed circuit board. The bottom stiffener frame is then moved into place against the bottom side of the circuit board and the slugs, and the top stiffener plate, printed circuit board, and bottom stiffener frame are secured together by fasteners that attached the top stiffener plate to the bottom stiffener frame. Third, a thermal management component or assembly, such as a cold plate assembly or a heat sink, is aligned with the mounting holes in the top stiffener plate (e.g., openings 948 in FIG. 9, openings 460 in FIG. 4) and the thermal management component or assembly is secured to the module by tightening screws in the mounting holes, thereby creating a low thermal resistance path between the bottom side electronic components and the thermal management component or assembly.

FIGS. 10A & 10B illustrate an example layout of electronic components on a printed circuit board that is part of an OAM-compliant module. FIGS. 10A and 10B illustrate the layout of electronic components on a top side 1004 and a bottom side 1008, respectively, of a module printed circuit board 1000. Attached to the top side 1004 of the board 1000 is a GPU with a TDP of 600 W 1012, four 4.0 W voltage regulator FETs 1016, two 1.2 W voltage regulator FETs 1020, and two 1.52 W inductors 1024. Attached to the bottom side 1008 of the board 1000 are 12 1.6 W voltage regulator FETs 1028, seven 1.2 W voltage regulator inductors 1032, and two connectors 1036 for connecting the printed circuit board 1000 to a baseboard. Thus, the total power consumption of the top side and bottom side electronic components are 9.44 W and 27.6 W, respectively.

Based on a computational analysis, the thermal performance of a module comprising a printed circuit board with top and bottom side electronic components arranged as illustrated in FIGS. 10A & 10B and comprising the mechanical cooling structures described herein provides sufficient cooling for the electronic components attached to the bottom side of the board. The modeled system on which the computation analysis was performed comprised the following characteristics: a GPU (600 W TDP) in a 62.5 mm×77.5 mm ball grid array (BGA) package attached to the top side of an OAM-compliant printed circuit board. The thermal performance was modeled using the Mentor Graphics® FLoTHERM computational fluid dynamics (CFD) tool. The simulation results indicate that the mechanical cooling structures disclosed herein using flexible thermal straps to cool the bottom side electronic components can reduce bottom side electronic component temperature by up to 10° C. relative to a cooling solution in which a TIM layer is used to thermally couple a top stiffener plate to a bottom stiffener frame (see FIG. 1).

The mechanical cooling structures disclosed herein can be used to provide cooling for electronic components attached to the bottom side of mezzanine form factor modules that are not OAM-compliant (e.g., modules that are wider, longer, narrower, shorter, have more space between the bottom side of the circuit board and the baseboard that OAM-compliant modules).

The mechanical cooling structures disclosed herein can allow for the freeing up of area on the top side of a printed circuit board by allowing for more electronic components to be moved to the bottom side of a processor unit module. Further, it can allow for higher power voltage regulator components to be placed on the bottom side of a module printed circuit board, thereby allowing for higher power processor units to be incorporated into the modules.

Figure 11:
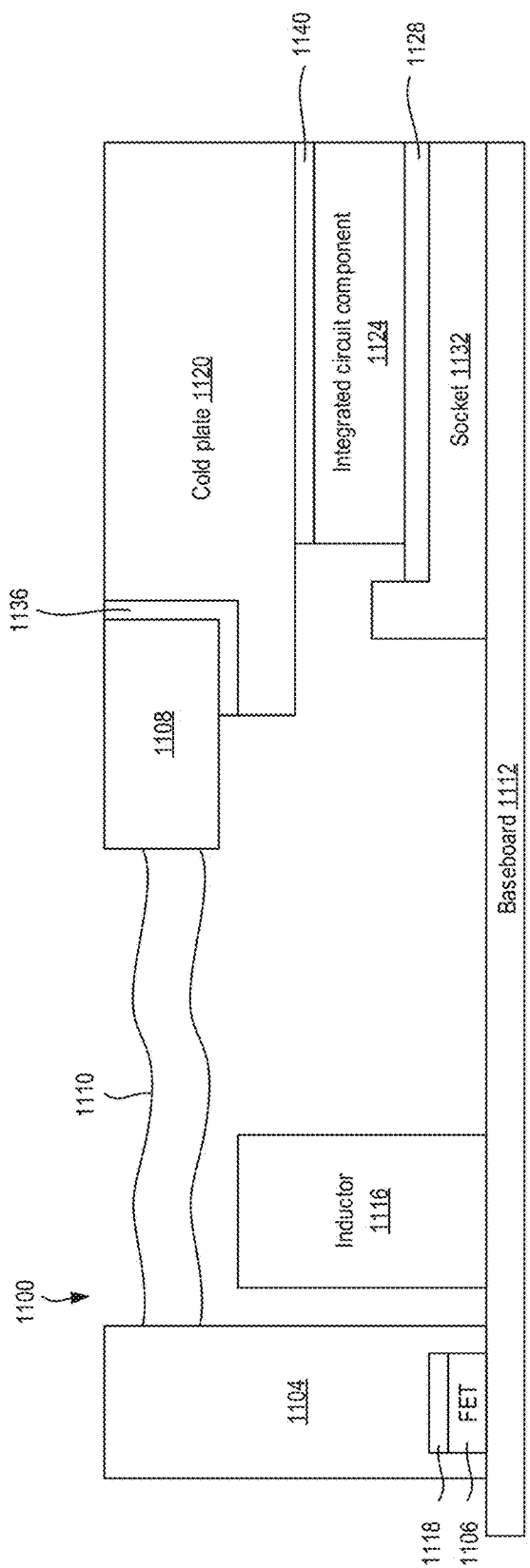
FIG. 11 is a cross-sectional view of an example flexible thermal straps to transport heat from a voltage regulator to a thermal management component attached to a processor unit mounted on the same side of a printed circuit board as the voltage regulator.

FIG. 11 is a cross-sectional view of an example flexible thermal strap to transport heat from a voltage regulator to a thermal management component attached to a processor unit mounted on the same side of a printed circuit board as the voltage regulator. The flexible thermal strap 1100 comprises a first block (or slug) 1104 at one end and a second block (or slug) 1108 at the other end. The first and second blocks 1104 and 1108 are connected by a plurality of stacked metal (e.g., copper, aluminum) foils or a plurality of ropes (e.g., copper ropes, graphite ropes) 1110. In embodiments where the strap 1100 comprises a plurality of stacked metal foils, the thickness of the individual foils can be 0.001". The first block 1104 is mounted to a VR FET 1106 that is mounted on a baseboard 1112. The VR FET is part a voltage regulator that also comprises an inductor 1116 that is also mounted on the baseboard 1112. A TIM layer 1118 thermally couples the first block 1104 to the VR FET 1106. The first block 1104 is attached to baseboard 1112. In some embodiments, the first block 1104 is attached to the baseboard 1112 using fasteners (not shown), such as screws. The first block 1104 becomes mounted to the VR FET 1106 by the first block 1104 being attached to the baseboard 1112.

The second block 1108 is attached to a cold plate 1120 attached to an integrated circuit component 1124. The second block 1108 can be attached to the cold plate 1120 via fasteners, such as screws. In other embodiments, the second block 1108 can be soldered or brazed to the cold plate (in which case there would be no TIM layer between the second block 1108 and the cold plate 1120). The integrated circuit component 1124 comprises a package substrate 1128, which is attached to the baseboard 1112 via a socket 1132. The cold plate 1120 is thermally coupled to the second block 1108 via a TIM layer 1136 and is thermally coupled to the integrated circuit component 1124 via a TIM layer 1140. The cold plate 1120 can be part of any of the liquid cooling systems described or referenced herein. In some embodiments, another thermal management component, such as a heat sink, can be used in place of the cold plate 1120.

The thermal strap configuration illustrated in FIG. 11 can accommodate height variations that can exist across variations (SKUs) of a particular integrated circuit component or height variations that occur across different integrated circuit component types. That is, a single flexible thermal strap design can be used to connect various voltage regulators to various integrated circuit components, to connect a single voltage regulator to various integrated circuit components, or to connect a single voltage regulator to various thermal management components to be used with a particular integrated circuit component. Further, the flexible thermal strap 1100 provides a cooling solution for the VR FET 1106 that does not impact socket loading during shock and vibration conditions. In some embodiments, the thermal strap 1100 attaches to a bolster plate that is part of a socket assembly. In such embodiments, the thermal strap 1100 does not impact the design of the thermal management component (e.g., cold plate 1120) attached to the integrated circuit component 1124.

Although the thermal strap 1100 is shown as providing cooling to a VR FET 1106 in FIG. 1100, flexible thermal straps can be used to transport heat generated by other computing system components mounted on the same side of a baseboard to which a thermal management component is mounted to an integrated circuit component. For example, a flexible thermal strap can transport heat from a memory, storage device, I/O controller, optical I/O components, chipset processor, network interface controller, or additional voltage regulator components (e.g., inductor 1116 or additional VR FETs) to a thermal management component.

The technologies described herein can be performed by or implemented in any of a variety of computing systems, including desktop computers, servers, workstations, stationary gaming consoles, set-top boxes, smart televisions, rack-level computing solutions (e.g., blade, tray, or sled computing systems), and embedded computing systems (e.g., computing systems that are part of a vehicle, smart home appliance, consumer electronics product or equipment, manufacturing equipment). As used herein, the term "computing system" includes computing devices and includes systems comprising multiple discrete physical components. In some embodiments, the computing systems are located in a data center, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves).

Figure 12:
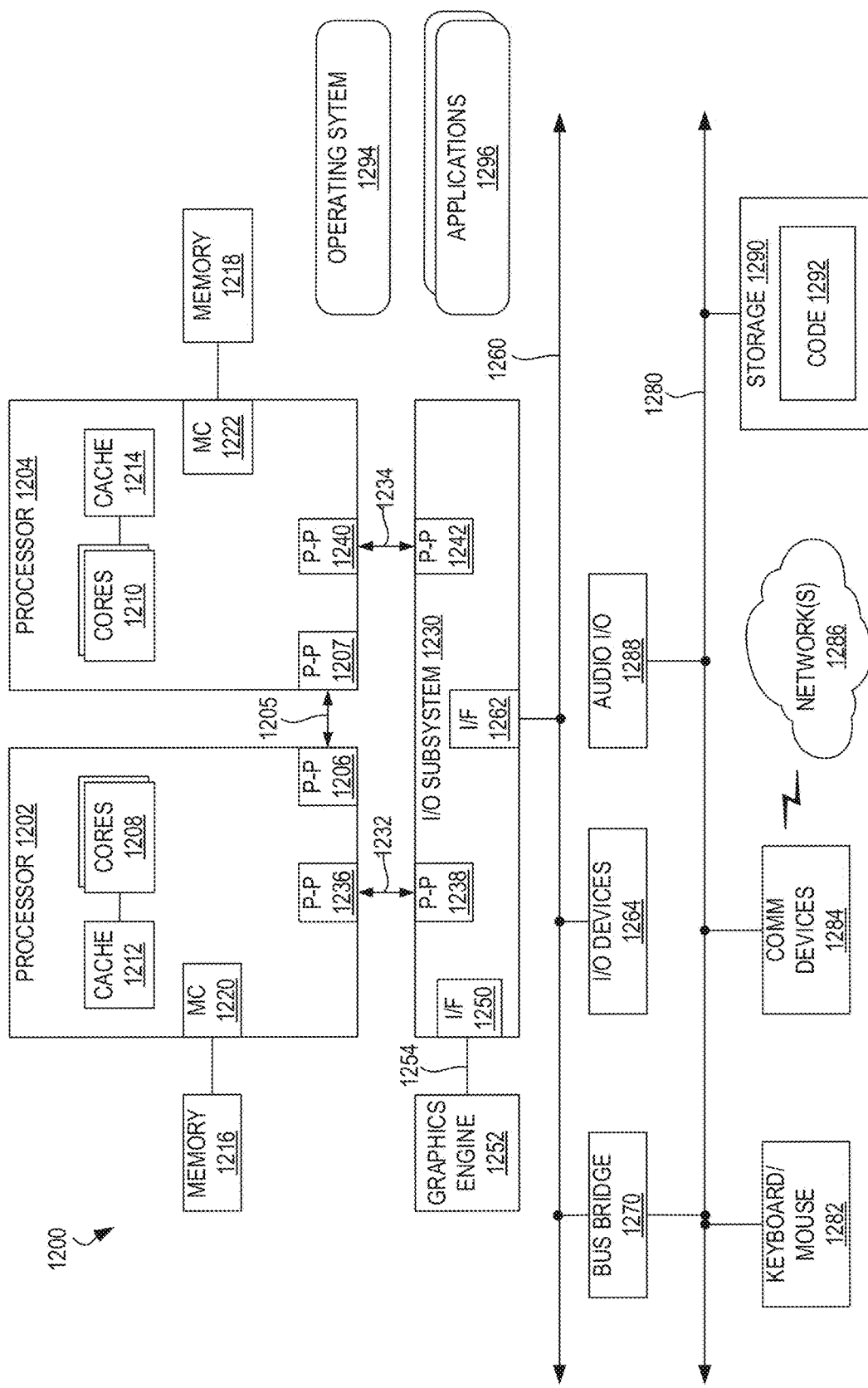
FIG. 12 is a block diagram of an example computing system in which technologies described herein may be implemented.

FIG. 12 is a block diagram of an example computing system in which technologies described herein may be implemented. Generally, components shown in FIG. 12 can communicate with other shown components, although not all connections are shown, for ease of illustration. The computing system 1200 is a multiprocessor system comprising a first processor unit 1202 and a second processor unit 1204 comprising point-to-point (P-P) interconnects. A point-to-point (P-P) interface 1206 of the processor unit 1202 is coupled to a point-to-point interface 1207 of the processor unit 1204 via a point-to-point interconnection 1205. It is to be understood that any or all of the point-to-point interconnects illustrated in FIG. 12 can be alternatively implemented as a multi-drop bus, and that any or all buses illustrated in FIG. 12 could be replaced by point-to-point interconnects.

The processor units 1202 and 1204 comprise multiple processor cores. Processor unit 1202 comprises processor cores 1208 and processor unit 1204 comprises processor cores 1210. Processor cores 1208 and 1210 can execute computer-executable instructions in a manner similar to that discussed below in connection with FIG. 13, or other manners.

Processor units 1202 and 1204 further comprise cache memories 1212 and 1214, respectively. The cache memories 1212 and 1214 can store data (e.g., instructions) utilized by one or more components of the processor units 1202 and 1204, such as the processor cores 1208 and 1210. The cache memories 1212 and 1214 can be part of a memory hierarchy for the computing system 1200. For example, the cache memories 1212 can locally store data that is also stored in a memory 1216 to allow for faster access to the data by the processor unit 1202. In some embodiments, the cache memories 1212 and 1214 can comprise multiple cache levels, such as level 1 (L1), level 2 (L2), level 3 (L3), level 4 (L4), and/or other caches or cache levels, such as a last level cache (LLC). Some of these cache memories (e.g., L2, L3, L4, LLC) can be shared among multiple cores in a processor unit. One or more of the higher levels of cache levels (the smaller and faster caches) in the memory hierarchy can be located on the same integrated circuit die as a processor core and one or more of the lower cache levels (the larger and slower caches) can be located on an integrated circuit dies that are physically separate from the processor core integrated circuit dies.

Although the computing system 1200 is shown with two processor units, the computing system 1200 can comprise any number of processor units. Further, a processor unit can comprise any number of processor cores. A processor unit can take various forms such as a central processing unit (CPU), a graphics processing unit (GPU), general-purpose GPU (GPGPU), accelerated processing unit (APU), field-programmable gate array (FPGA), neural network processing unit (NPU), data processor unit (DPU), accelerator (e.g., graphics accelerator, digital signal processor (DSP), compression accelerator, artificial intelligence (AI) accelerator), controller, or other types of processor units. As such, the processor unit can be referred to as an XPU (or xPU). Further, a processor unit can comprise one or more of these various types of processor units. In some embodiments, the computing system comprises one processor unit with multiple cores, and in other embodiments, the computing system comprises a single processor unit with a single core. As used herein, the terms "processor unit" and "processing unit" can refer to any processor, processor core, component, module, engine, circuitry, or any other processing element described or referenced herein.

In some embodiments, the computing system 1200 can comprise one or more processor units that are heterogeneous or asymmetric to another processor unit in the computing system. There can be a variety of differences between the processor units in a system in terms of a spectrum of metrics of merit including architectural, microarchitectural, thermal, power consumption characteristics, and the like. These differences can effectively manifest themselves as asymmetry and heterogeneity among the processor units in a system.

The processor units 1202 and 1204 can be located in a single integrated circuit component (such as a multi-chip package (MCP) or multi-chip module (MCM)) or they can be located in separate integrated circuit components. An integrated circuit component comprising one or more processor units can comprise additional components, such as embedded DRAM, stacked high bandwidth memory (HBM), shared cache memories (e.g., L3, L4, LLC), input/output (I/O) controllers, or memory controllers. Any of the additional components can be located on the same integrated circuit die as a processor unit, or on one or more integrated circuit dies separate from the integrated circuit dies comprising the processor units. In some embodiments, these separate integrated circuit dies can be referred to as "chiplets". In some embodiments where there is heterogeneity or asymmetry among processor units in a computing system, the heterogeneity or asymmetric can be among processor units located in the same integrated circuit component.

Processor units 1202 and 1204 further comprise memory controller logic (MC) 1220 and 1222. As shown in FIG. 12, MCs 1220 and 1222 control memories 1216 and 1218 coupled to the processor units 1202 and 1204, respectively. The memories 1216 and 1218 can comprise various types of volatile memory (e.g., dynamic random-access memory (DRAM), static random-access memory (SRAM)) and/or non-volatile memory (e.g., flash memory, chalcogenide-based phase-change non-volatile memories), and comprise one or more layers of the memory hierarchy of the computing system. While MCs 1220 and 1222 are illustrated as being integrated into the processor units 1202 and 1204, in alternative embodiments, the MCs can be external to a processor unit.

Processor units 1202 and 1204 are coupled to an Input/Output (I/O) subsystem 1230 via point-to-point interconnections 1232 and 1234. The point-to-point interconnection 1232 connects a point-to-point interface 1236 of the processor unit 1202 with a point-to-point interface 1238 of the I/O subsystem 1230, and the point-to-point interconnection 1234 connects a point-to-point interface 1240 of the processor unit 1204 with a point-to-point interface 1242 of the I/O subsystem 1230. Input/Output subsystem 1230 further includes an interface 1250 to couple the I/O subsystem 1230 to a graphics engine 1252. The I/O subsystem 1230 and the graphics engine 1252 are coupled via a bus 1254.

The Input/Output subsystem 1230 is further coupled to a first bus 1260 via an interface 1262. The first bus 1260 can be a Peripheral Component Interconnect Express (PCIe) bus or any other type of bus. Various I/O devices 1264 can be coupled to the first bus 1260. A bus bridge 1270 can couple the first bus 1260 to a second bus 1280. In some embodiments, the second bus 1280 can be a low pin count (LPC) bus. Various devices can be coupled to the second bus 1280 including, for example, a keyboard/mouse 1282, audio I/O devices 1288, and a storage device 1290, such as a hard disk drive, solid-state drive, or another storage device for storing computer-executable instructions (code) 1292 or data. The code 1292 can comprise computer-executable instructions for performing methods described herein. Additional components that can be coupled to the second bus 1280 include communication device(s) 1284, which can provide for communication between the computing system 1200 and one or more wired or wireless networks 1286 (e.g., Wi-Fi, cellular, or satellite networks) via one or more wired or wireless communication links (e.g., wire, cable, Ethernet connection, radio-frequency (RF) channel, infrared channel, Wi-Fi channel) using one or more communication standards (e.g., IEEE 1202.11 standard and its supplements).

In embodiments where the communication devices 1284 support wireless communication, the communication devices 1284 can comprise wireless communication components coupled to one or more antennas to support communication between the computing system 1200 and external devices. The wireless communication components can support various wireless communication protocols and technologies such as Near Field Communication (NFC), IEEE 1002.11 (Wi-Fi) variants, WiMax, Bluetooth, Zigbee, 4G Long Term Evolution (LTE), Code Division Multiplexing Access (CDMA), Universal Mobile Telecommunication System (UMTS) and Global System for Mobile Telecommunication (GSM), and 5G broadband cellular technologies. In addition, the wireless modems can support communication with one or more cellular networks for data and voice communications within a single cellular network, between cellular networks, or between the computing system and a public switched telephone network (PSTN).

The system 1200 can comprise removable memory such as flash memory cards (e.g., SD (Secure Digital) cards), memory sticks, Subscriber Identity Module (SIM) cards). The memory in system 1200 (including caches 1212 and 1214, memories 1216 and 1218, and storage device 1290) can store data and/or computer-executable instructions for executing an operating system 1294 and application programs 1296. Example data includes web pages, text messages, images, sound files and video data to be sent to and/or received from one or more network servers or other devices by the system 1200 via the one or more wired or wireless networks 1286, or for use by the system 1200. The system 1200 can also have access to external memory or storage (not shown) such as external hard drives or cloud-based storage.

The operating system 1294 can control the allocation and usage of the components illustrated in FIG. 12 and support the one or more application programs 1296. The application programs 1296 can include common computing system applications (e.g., email applications, calendars, contact managers, web browsers, messaging applications) as well as other computing applications.

The computing system 1200 can support various additional input devices, such as a touchscreen, microphone, monoscopic camera, stereoscopic camera, trackball, touchpad, trackpad, proximity sensor, light sensor, electrocardiogram (ECG) sensor, PPG (photoplethysmogram) sensor, galvanic skin response sensor, and one or more output devices, such as one or more speakers or displays. Other possible input and output devices include piezoelectric and other haptic I/O devices. Any of the input or output devices can be internal to, external to, or removably attachable with the system 1200. External input and output devices can communicate with the system 1200 via wired or wireless connections.

In addition, the computing system 1200 can provide one or more natural user interfaces (NUIs). For example, the operating system 1294 or applications 1296 can comprise speech recognition logic as part of a voice user interface that allows a user to operate the system 1200 via voice commands. Further, the computing system 1200 can comprise input devices and logic that allows a user to interact with computing the system 1200 via body, hand or face gestures.

The system 1200 can further include at least one input/output port comprising physical connectors (e.g., USB, IEEE 1394 (FireWire), Ethernet, RS-232), a power supply (e.g., battery), a global satellite navigation system (GNSS) receiver (e.g., GPS receiver); a gyroscope; an accelerometer; and/or a compass. A GNSS receiver can be coupled to a GNSS antenna. The computing system 1200 can further comprise one or more additional antennas coupled to one or more additional receivers, transmitters, and/or transceivers to enable additional functions.

It is to be understood that FIG. 12 illustrates only one example computing system architecture. Computing systems based on alternative architectures can be used to implement technologies described herein. For example, instead of the processors 1202 and 1204 and the graphics engine 1252 being located on discrete integrated circuits, a computing system can comprise an SoC (system-on-a-chip) integrated circuit incorporating multiple processors, a graphics engine, and additional components. Further, a computing system can connect its constituent component via bus or point-to-point configurations different from that shown in FIG. 12. Moreover, the illustrated components in FIG. 12 are not required or all-inclusive, as shown components can be removed and other components added in alternative embodiments.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following examples pertain to additional embodiments of technologies disclosed herein.

Example 1 is a module comprising: a top stiffener plate; a slug; a flexible thermal strap connecting the top stiffener plate to the slug; a bottom stiffener frame attached to the top stiffener plate; and a printed circuit board comprising an integrated circuit component attached to a top side of the printed circuit board and an electronic component attached to a bottom side of the printed circuit board, the printed circuit board located between the top stiffener plate, the bottom stiffener frame and the electronic component thermally coupled to the slug.

Example 2 comprises the module of Example 1, wherein the top stiffener plate comprises a frame and the flexible thermal strap connects the frame to the slug.

Example 3 comprises the module of Example 2, wherein the frame is made of a first material that is different from a second material from which the top stiffener plate is made.

Example 4 comprises the module of any one of Examples 2-3, wherein the frame is soldered or brazed to the top stiffener plate.

Example 5 comprises the module of any one of Examples 2-4, wherein the frame is made of copper.

Example 6 comprises the module of any one of Examples 2-5, wherein the top stiffener plate is made of copper.

Example 7 comprises the module of any one of Examples 2-6, wherein the flexible thermal strap is a copper thermal strap.

Example 8 comprises the module of Example 7, wherein the copper thermal strap comprises a plurality of copper ropes.

Example 8.1 comprises the module of Example 7, wherein the copper thermal strap comprises a plurality of stacked copper sheets.

Example 9 comprises the module of any one of Examples 2-6, wherein the flexible thermal strap is a graphite thermal strap.

Example 10 comprises the module of Example 9, wherein the graphite thermal strap comprises a plurality of graphite ropes.

Example 10.1 comprises the module of Example 9, wherein the graphite thermal strap comprises a plurality of stacked graphite sheets.

Example 11 comprises the module of any one of Examples 2-10, wherein the top stiffener plate comprises one or more heat pipes.

Example 11.1 comprises the module of any one of Examples 2-10, wherein the top stiffener plate comprises one or more vapor chambers.

Example 11.5 comprises the module of any one of Examples 2-6, wherein the flexible thermal strap is an aluminum thermal strap.

Example 11.6 comprises the module of Example 11.5, wherein the graphite thermal strap comprises a plurality of stacked aluminum sheets.

Example 12 comprises the module of any one of Examples 2-11, wherein the slug comprises one or more heat pipes.

Example 12.1 comprises the module of any one of Examples 2-11, wherein the slug comprises one or more vapor chambers.

Example 13 comprises the module of any one of Examples 2-12, wherein the electronic component is thermally coupled to the slug via the bottom stiffener frame.

Example 14 comprises the module of any one of Examples 2-13, wherein the top stiffener plate comprises an opening occupied by the integrated circuit component, the module further comprising a heat sink attached to the top stiffener plate and thermally coupled to the integrated circuit component.

Example 15 comprises the module of any one of Examples 2-14, wherein the top stiffener plate comprises an opening occupied by the integrated circuit component, the module further comprising a cold plate attached to the top stiffener plate and thermally coupled to the integrated circuit component.

Example 16 comprises the module of any one of Examples 2-15, wherein the top stiffener plate is physically coupled to the bottom stiffener frame by a plurality of fasteners.

Example 17 comprises the module of any one of Examples 2-16, wherein the module is removably attachable to a baseboard by one or more connectors attached to the printed circuit board.

Example 18 comprises the module of any one of Examples 2-17, wherein the electronic component comprises a voltage regulator field-effect transistor.

Example 19 comprises the module of any one of Examples 2-18, wherein the electronic component comprises an inductor.

Example 20 comprises the module of any one of Examples 2-19, wherein the slug is a first slug, the flexible thermal strap is a first flexible thermal strap, and the electronic component is a first electronic component, the module further comprising: a second slug; a second electronic component attached to the bottom side of the printed circuit board; and a second flexible thermal strap connecting the top stiffener plate to the second slug, the second electronic component thermally coupled to the second slug.

Example 21 is a computing system, comprising: a baseboard; a module attached to the baseboard, the module comprising: a top stiffener plate comprising an opening; a slug; a flexible thermal strap connecting the top stiffener plate to the slug; a bottom stiffener frame attached to the top stiffener plate; and a printed circuit board comprising an integrated circuit component attached to a top side of the printed circuit board and an electronic component attached to a bottom side of the printed circuit board, the printed circuit board located between the top stiffener plate and the bottom stiffener frame, the electronic component thermally coupled to the slug, and the opening of the top stiffener plate occupied by the integrated circuit component; and a thermal management component attached to the module and thermally coupled to the integrated circuit component.

Example 22 comprises the computing system of Example 21, wherein the top stiffener plate comprises a frame and the flexible thermal strap connects the frame to the slug.

Example 23 comprises the computing system of Example 22, wherein the frame is made of a first material that is different from a second material from which the top stiffener plate is made.

Example 24 comprises the computing system of any one of Examples 22-23, wherein the frame is soldered or brazed to the top stiffener plate.

Example 25 comprises the computing system of any one of Examples 22-24, wherein the frame is made of copper.

Example 26 comprises the computing system of any one of Examples 21-25, wherein the top stiffener plate is made of copper.

Example 27 comprises the computing system of any one of Examples 21-26, wherein the flexible thermal strap is a copper thermal strap.

Example 28 comprises the computing system of Example 27, wherein the copper thermal strap comprises a plurality of copper ropes.

Example 29 comprises the computing system of any one of Examples 21-26, wherein the flexible thermal strap is a graphite thermal strap.

Example 30 comprises the computing system of Example 29, wherein the graphite thermal strap comprises a plurality of graphite ropes.

Example 31 comprises the computing system of any one of Examples 21-30, wherein the top stiffener plate comprises one or more heat pipes.

Example 31.5 comprises the computing system of any one of Examples 21-30, wherein the top stiffener plate comprises one or more vapor chambers.

Example 32 comprises the computing system of any one of Examples 21-31, wherein the slug comprises one or more heat pipes.

Example 32.5 comprises the computing system of any one of Examples 21-31, wherein the slug comprises one or more vapor chambers.

Example 33 comprises the computing system of any one of Examples 21-32, wherein the electronic component is thermally coupled to the slug via the bottom stiffener frame.

Example 34 comprises the computing system of any one of Examples 21-33, wherein the thermal management component comprises a heat sink.

Example 35 comprises the computing system of any one of Examples 21-34, wherein the thermal management component comprises a cold plate.

Example 36 comprises the computing system of Example 35, wherein the cold plate is part of a liquid cooling system that cools one or more additional integrated circuit component of the computing system.

Example 37 comprises the computing system of Example 35, wherein the cold plate is part of a liquid cooling system that cools one or more additional integrated circuit component of one or more additional computing systems.

Example 38 comprises the computing system of any one of Examples 21-37, further comprising one or more additional integrated circuit component attached to the baseboard.

Example 39 comprises the computing system of any one of Examples 21-38, wherein the top stiffener plate is physically coupled to the bottom stiffener frame by a plurality of fasteners.

Example 40 comprises the computing system of any one of Examples 21-39, wherein the module is removably attached to the baseboard.

Example 41 is an apparatus, comprising: a top stiffener plate; a slug; a printed circuit board comprising an integrated circuit component attached to a top side of the printed circuit board and an electronic component attached to a bottom side of the printed circuit board, the electronic component thermally coupled to the slug; a bottom stiffener frame attached to the top stiffener plate; a thermal management component attached to the top stiffener plate; and a cooling means to transport heat from the electronic component to the thermal management component.

Example 42 comprises the apparatus of Example 41, wherein the thermal management component comprises a heat sink.

Example 43 comprises the apparatus of Example 41, wherein the thermal management component comprises a cold plate.

Example 44 is a computing system, comprising: an integrated circuit component attached to a printed circuit board; a thermal management component attached to the integrated circuit component; an electronic component attached to the printed circuit board; and a flexible thermal strap mounted to the electronic component and attached to the thermal management component.

Example 45 comprises the computing system of Example 44, wherein the flexible thermal strap comprises a plurality of stacked metal foils.

Example 46 comprises the computing system of Example 45, wherein the metal foils are copper foils.

Example 47 comprises the computing system of Example 45, wherein the metal foils are aluminum foils.

Example 47.1 comprises the computing system of Example 45, wherein the metal foils are graphite foils.

Example 48 comprises the computing system of Example 44, wherein the flexible thermal strap comprises a plurality of copper ropes.

Example 49 comprises the computing system of Example 44, wherein the flexible thermal strap comprises a plurality of graphite ropes.

Example 50 comprises the computing system of any one of Examples 44-49, wherein the flexible thermal strap is attached to the printed circuit board via one or more fasteners.

Example 51 comprises the computing system of any one of Examples 44-50, wherein the electronic component comprises a voltage regulator field-effect transistor.

Example 52 comprises the computing system of any one of Examples 44-51, wherein the thermal management component comprises a heat sink.

Example 53 comprises the computing system of any one of Examples 44-52, wherein the thermal management component comprises a cold plate.

Example 54 is a computing system, comprising: an integrated circuit component attached to a printed circuit board; a thermal management component attached to the integrated circuit component; an electronic component attached to the printed circuit board; and a cooling means to transport heat from the electronic component to the thermal management component.

Example 55 comprises the computing system of claim 54, wherein the thermal management component comprises a heat sink.

Example 56 comprises the computing system of claim 54, wherein the thermal management component comprises a cold plate.

The invention claimed is:

1. A module comprising:
a top stiffener plate;
a slug;
a flexible thermal strap connecting the top stiffener plate to the slug;
a bottom stiffener frame attached to the top stiffener plate; and
a printed circuit board comprising an integrated circuit component attached to a top side of the printed circuit board and an electronic component attached to a bottom side of the printed circuit board, the printed circuit board located between the top stiffener plate and the bottom stiffener frame, the electronic component thermally coupled to the slug.

2. The module of claim 1, wherein the top stiffener plate comprises a frame and the flexible thermal strap connects the frame to the slug.

3. The module of claim 2, wherein the frame is made of a first material that is different from a second material from which the top stiffener plate is made.

4. The module of claim 3, wherein the frame is made of copper.

5. The module of claim 1, wherein the top stiffener plate is made of copper.

6. The module of claim 1, wherein the flexible thermal strap is a copper thermal strap.

7. The module of claim 1, wherein the flexible thermal strap is a graphite thermal strap.

8. The module of claim 1, wherein the top stiffener plate comprises one or more heat pipes.

9. The module of claim 1, wherein the slug comprises one or more heat pipes.

10. The module of claim 1, wherein the electronic component is thermally coupled to the slug via the bottom stiffener frame.

11. The module of claim 1, wherein the top stiffener plate comprises an opening occupied by the integrated circuit component, the module further comprising a heat sink attached to the top stiffener plate and thermally coupled to the integrated circuit component.

12. The module of claim 1, wherein the top stiffener plate comprises an opening occupied by the integrated circuit component, the module further comprising a cold plate attached to the top stiffener plate and thermally coupled to the integrated circuit component.

13. The module of claim 1, wherein the electronic component comprises a voltage regulator field-effect transistor.

14. The module of claim 1, wherein the slug is a first slug, the flexible thermal strap is a first flexible thermal strap, and the electronic component is a first electronic component, the module further comprising:
a second slug;

a second electronic component attached to the bottom side of the printed circuit board; and a second flexible thermal strap connecting the top stiffener plate to the second slug, the second electronic component thermally coupled to the second slug.

15. A computing system, comprising:

a baseboard;

a module attached to the baseboard, the module comprising:
- a top stiffener plate comprising an opening;
- a slug;
- a flexible thermal strap connecting the top stiffener plate to the slug;
- a bottom stiffener frame attached to the top stiffener plate; and
- a printed circuit board comprising an integrated circuit component attached to a top side of the printed circuit board and an electronic component attached to a bottom side of the printed circuit board, the printed circuit board located between the top stiffener plate and the bottom stiffener frame, the electronic component thermally coupled to the slug, and the opening of the top stiffener plate occupied by the integrated circuit component; and a thermal management component attached to the module and thermally coupled to the integrated circuit component.

16. The computing system of claim 15, wherein the top stiffener plate comprises a frame and the flexible thermal strap connects the frame to the slug.

17. The computing system of claim 15, wherein the flexible thermal strap is a copper thermal strap or a graphite thermal strap.

18. The computing system of claim 15, wherein the top stiffener plate comprises one or more heat pipes.

19. The computing system of claim 15, wherein the slug comprises one or more heat pipes.

20. The computing system of claim 15, wherein the thermal management component comprises a heat sink.

21. The computing system of claim 15, wherein the thermal management component comprises a cold plate.

22. The computing system of claim 21, wherein the cold plate is part of a liquid cooling system that cools one or more additional integrated circuit components of the computing system.

23. The computing system of claim 21, wherein the cold plate is part of a liquid cooling system that cools one or more additional integrated circuit component of one or more additional computing systems.

24. An apparatus comprising:
- a top stiffener plate;
- one or more bottom conductive elements;
- a flexible thermal strap connecting the top plate to the one or more bottom conductive elements; and
- a printed circuit board comprising an integrated circuit component attached to a top side of the printed circuit board and an electronic component attached to a bottom side of the printed circuit board, the printed circuit board located between the top plate and the one or more bottom conductive elements, the electronic component thermally coupled to the one or more bottom conductive elements.

25. The apparatus of claim 24, further including a thermal management component thermally coupled to the integrated circuit component, wherein the thermal management component comprises a cold plate.

* * * * *